United States Patent [19]

Yamamoto

[11] 3,828,231

[45] Aug. 6, 1974

[54] LIGHT AMPLIFIER USING A SEMICONDUCTOR

[75] Inventor: Takaya Yamamoto, Yokohama, Japan

[73] Assignee: Kokusai Denshin Denwa Kabushiki Kaisha, Tokyo-to, Japan

[22] Filed: Dec. 18, 1972

[21] Appl. No.: 315,834

[30] Foreign Application Priority Data

Dec. 20, 1971 Japan .......................... 46-102627

[52] U.S. Cl. .......................... 357/30, 330/34, 330/4.3, 330/12, 307/311, 307/312, 331/94.5 H

[51] Int. Cl. .......................... H01l 15/00

[58] Field of Search .......... 317/235 N; 330/34, 4.3, 330/12; 307/311, 312; 331/94.5 H

[56] References Cited

UNITED STATES PATENTS

| | | | |
|---|---|---|---|
| 3,303,431 | 2/1967 | Fowler | 331/94.5 |
| 3,467,906 | 9/1969 | Cornely | 330/4.3 |
| 3,484,713 | 12/1969 | Fenner | 331/94.5 |
| 3,551,842 | 12/1970 | Nelson | 331/94.5 |
| 3,724,926 | 4/1973 | Lee | 350/160 R |

*Primary Examiner*—Martin H. Edlow
*Attorney, Agent, or Firm*—Robert E. Burns; Emmanuel J. Lobato; Bruce L. Adams

[57] ABSTRACT

A light amplifier using a semiconductor, in which an elongated single semiconductor PN junction is used for amplifying an input light injected at an input face provided at one end of the PN junction along the junction plane of the PN junction. The semiconductor PN junction is driven by bias signals applied at a common ohmic electrode and a plurality of ohmic electrodes respectively provided at opposite sides of the PN junction with respect to the junction plane. A plurality of the ohmic electrodes are sequencially arranged overlying the PN junction in a longitudinal direction and are electrically isolated from one another, so that a plurality of discrete regions are provided in the PN junction corresponding to the respective electrodes. Two adjacent regions are employed as one unitary region and are driven by predetermined different forward bias currents to bias one of the two regions as an amplifying region and the other of the two regions as a saturable absorbing region. The amplifying region is disposed at the input side while the saturable absorbing region is disposed at the output side in each unitary region. The respective unitary regions are connected in cascade to provide a plurality of the unitary regions.

3 Claims, 12 Drawing Figures

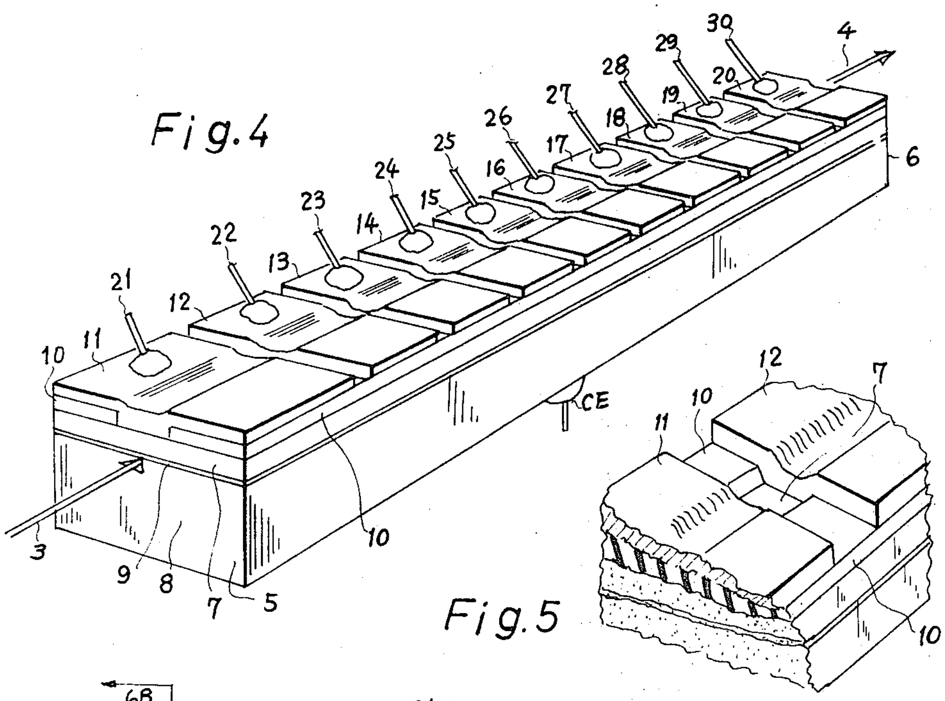
Fig. 4 Fig. 5
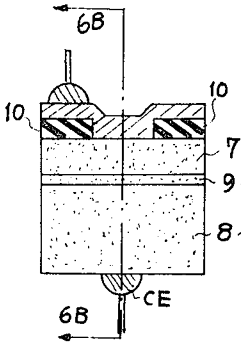
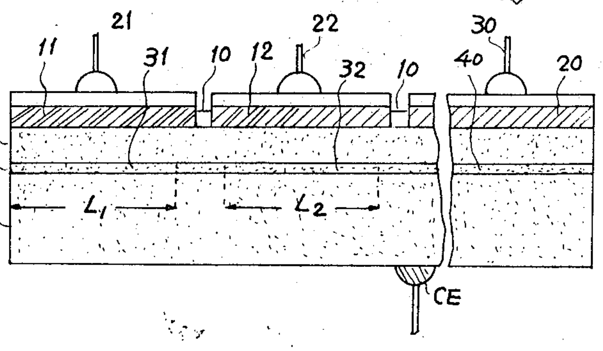
Fig. 6A
Fig. 6B

LIGHT AMPLIFIER USING A SEMICONDUCTOR

This invention relates to a light amplifier using a semiconductor in which a threshold level is provided with respect to its input-output characteristic.

There have heretofore been proposed light amplifiers each having a threshold level in its input-output characteristic. However, it is very difficult to obtain a desired threshold level and a desired saturation level therein.

An object of this invention is to provide a light amplifier using a semiconductor obtainable of a desired threshold level and a desired suturation level.

The object, principle, construction and operations of this invention will be clearly understood from the following detailed description taken in conjunction with the accompanying drawings: in which:

FIG. 4 is a perspective view illustrating one example of this invention;

FIG. 5 is an enlarged perspective view showing a part of the example shown in FIG. 4;

Figure 7:
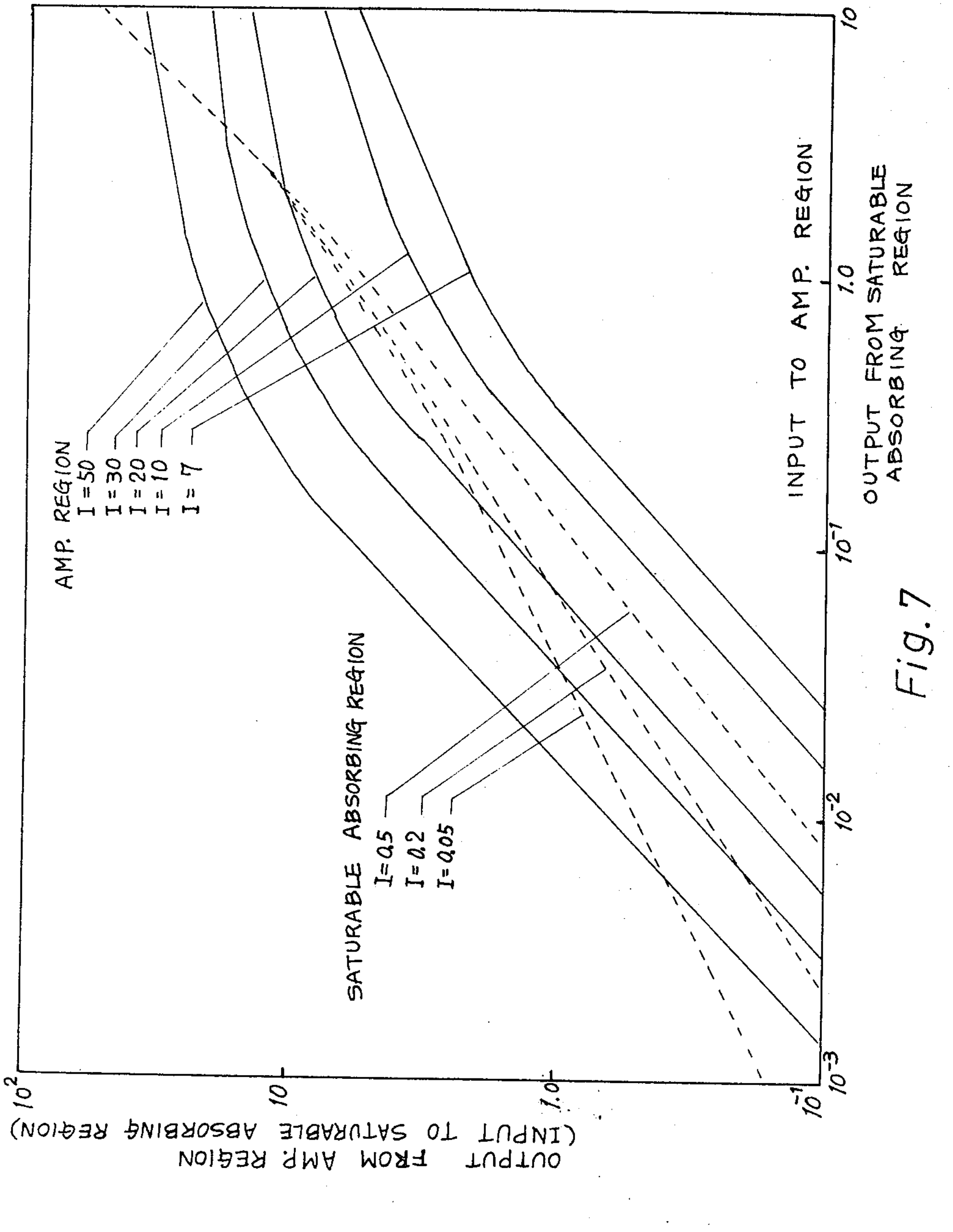
Figure 8:
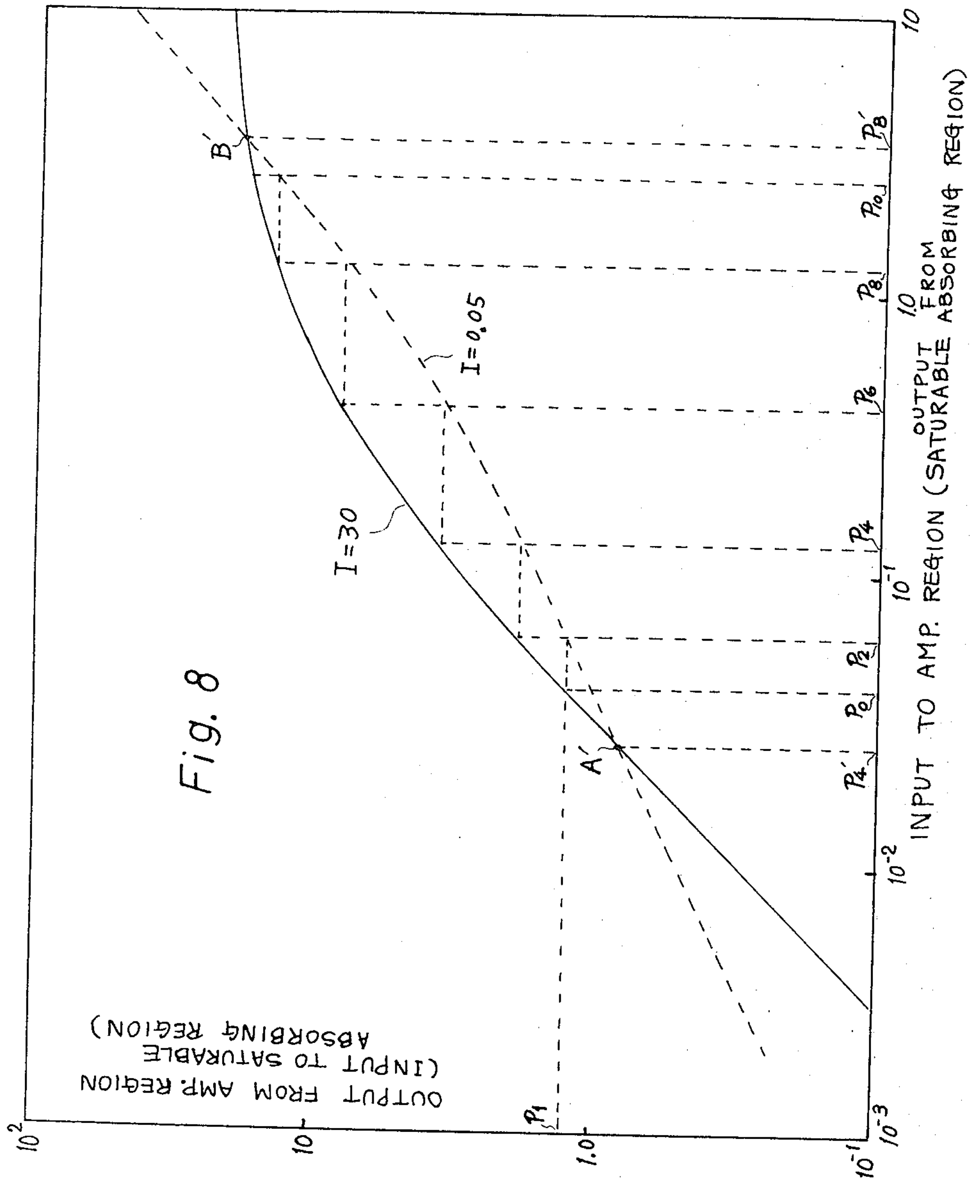
Figure 11:
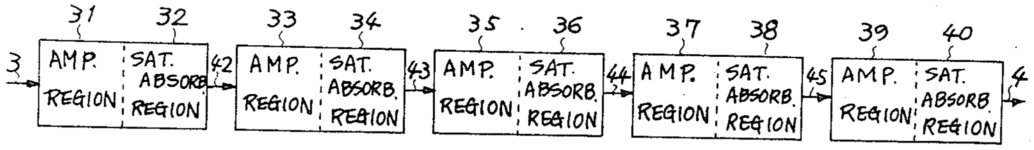
Figure 9:
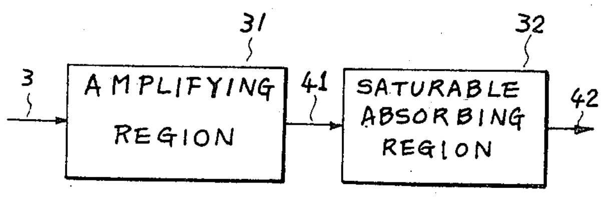
Figure 10:
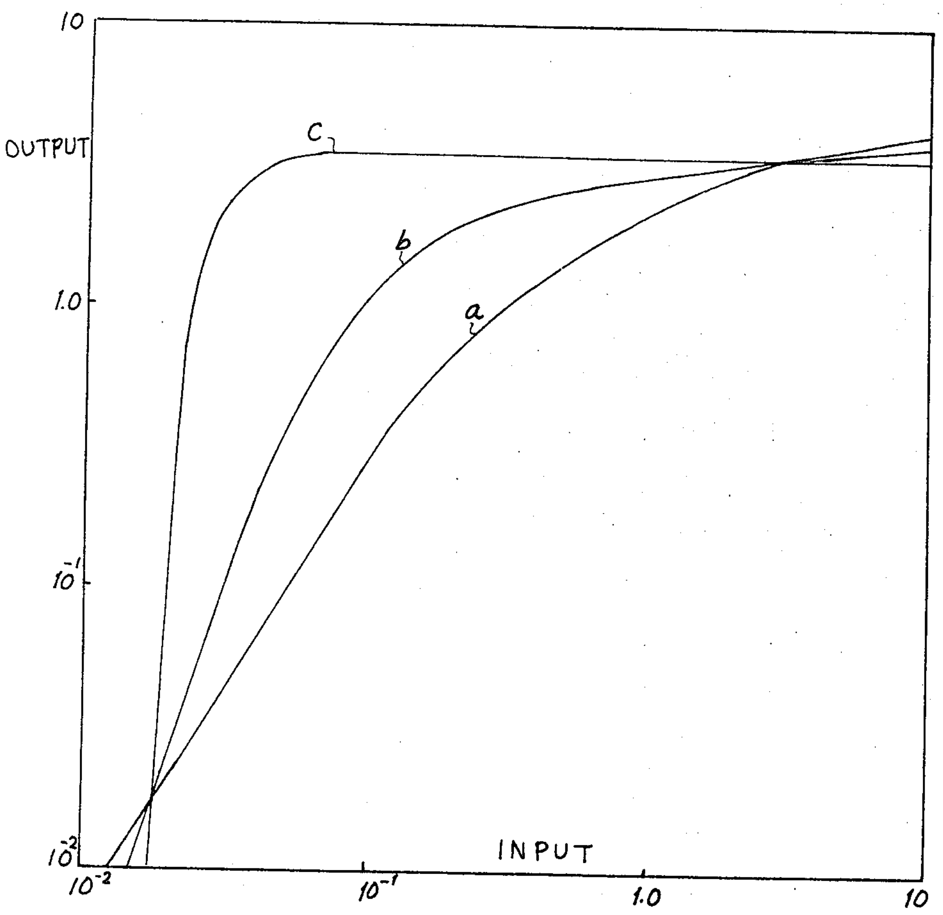

FIGS. 6A and B are a side view of the part of FIG. 4 and a cross-sectional view along a line 6B—6B showing an amplifying region and a saturable absorbing region;

FIG. 7 is a graph showing the input-output characteristics of the amplifying region and the saturable absorbing region with respect to an amount I proportional to a drive current used as a parameter;

FIG. 8 is a graph showing characteristic curves of I=30 and I=0.05 in FIG. 6 for explaining the existence of the threshold level;

FIG. 9 is a block diagram illustrating the basic circuit construction for use in this invention;

FIG. 10 is a graph showing input-output characteristics of one stage (curve *a*) of the amplifier of FIG. 8 and two cascade connected stages (curve *b*) and five stages (curve *c*) of the amplifiers of FIG. 8; and FIG. 11 is a block diagram of the light amplifier having five stages in accordance with this invention.

Figure 1:
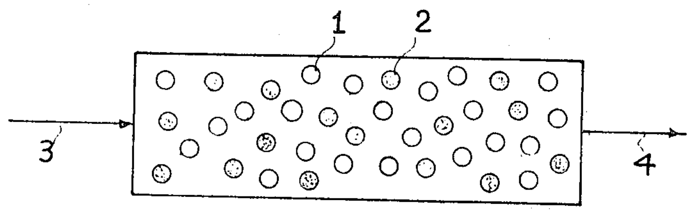
FIG. 1 is a diagram for explaining a conventional light amplifier having a threshold level in its input-output characteristic.
Figure 2:
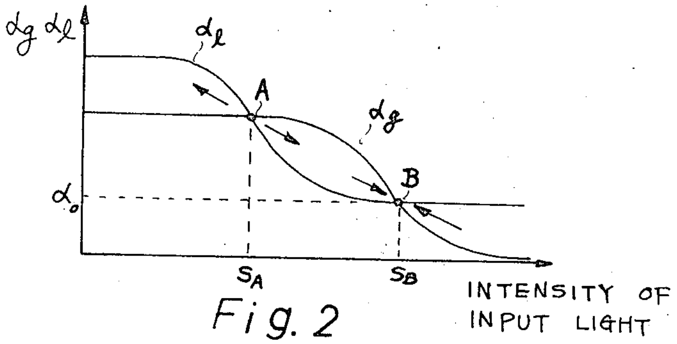
FIG. 2 is a graph showing characteristics of amplification and attenuation coefficients for explaining the operation of the light amplifier of FIG. 1.
Figure 3:
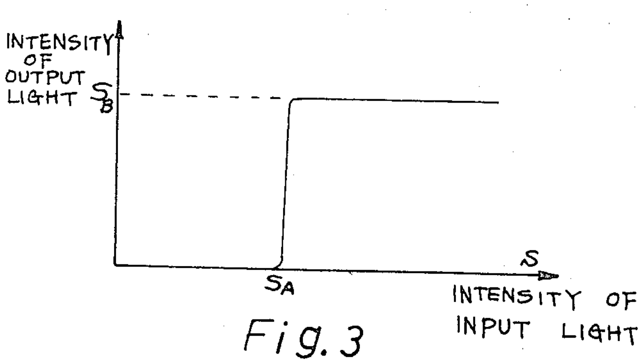
FIG. 3 is a graph showing the input-output characteristic of the light amplifier of FIG. 1.

To make the object and merits of this invention clear, the conventional art will first be discribed below. As shown in FIG. 1, an active material 1 having a laser action and a saturable absorbing material 2 having a saturation characteristic in its attenuation coefficient are uniformly contained in a mother crystal. For example, neodymium ($Nd^{3+}$) and uranium oxide ($UO_2^{2+}$) are contained as an active material and as an absorbing material respectively in glass. In FIG. 1, a reference numeral 3 indicates an input light and 4 an output light. The mode of operation of the light amplifier is as follows. FIG. 2 shows the amplification coefficiency $\alpha_g$ of the active material per unit length, and the attenuation coefficient $\alpha_l$ of the saturable absorbing material including an attenuation coefficient $\alpha_o$ inherent to the system. Intersecting points A and B of the curves $\alpha_g$ and $\alpha_l$ are an unstable point and a stable point respectively. Namely, in a case where light of an intensity a little lower than that $S_A$ corresponding to the point A is injected to the amplifier, the amplifier operates as an attenuation system because $\alpha_l > \alpha_g$ and, as the light is transmitted in the amplifier, it becomes less intense. The less intense the light becomes, the more $\alpha_l$ exceeds $\alpha_g$ to further attenuate the light. If the amplifier is sufficiently long, the output light intensity can be regarded as zero. On the other hand, in a case where light of an intensity a little higher than that $S_A$ is injected to the amplifier, a phenomenon opposite to that described above occurs and the light is amplified while progressing in the amplifier. However, when its intensity exceeds an intensity $S_B$ corresponding to the intersecting point B, since the amplifier serves again as the attenuator system, the light having transmitted over a sufficient distance finally comes to have the intensity $S_B$ and this becomes an output light. Accordingly, the input-output characteristic of this amplifier is such as shown in FIG. 3 and the intensity $S_A$ becomes a threshold level.

If the density, the relaxation time and the transition probability of the active material are taken as $N_e$, $T_e$ and $B_e$, and if those of the saturable absorbing material are taken as $N_a$, $T_a$ and $B_a$, the amplification coefficient $\alpha_g$ and the attenuation coefficient $\alpha_l$ shown in FIG. 2 are given as functions of the photon density by the following equations:

$$\alpha_g = h\,\nu \cdot N_e \cdot B_e/2\,(\,1 + B_e \cdot T_e \cdot S\,) \quad (1)$$

$$\alpha_l = h\,\nu \cdot N_a \cdot B_a/2\,(\,1 + B_a \cdot T_a \cdot S\,) + \alpha_o \quad (2)$$

where $h$ is a planck's constant and $\nu$ the frequency of light. In order to obtain such two stable points as shown in FIG. 2, it is necessary that conditions $N_e > N_a$, $T_e > T_a$ and $B_e < B_a$ must be satisfied. In addition to such a condition, another important condition further required is that the wavelength of the active material exhibiting the laser action must be coincident with the absorption spectrum (wavelength) of the saturable absorbing material. It is extremely difficult in practice to find out a material which well satisfies all of these severe conditions and enables satisfactory doping of the active material with the saturable absorbing material.

In the variables determining the threshold level, the relaxation time and the transition probability are fixed constants inherent to the material and it is only the density of the material with which the threshold level can be controlled. Therefore, even if it is expected that a desired threshold level may well be obtained by changing the density, the density is susceptible to the influence of the manufacturing process, and after the manufacture the threshold level is fixed and impossible to control and adjust. Accordingly, it is not easy to obtain a desired threshold value $S_A$ and a saturation value $S_B$. In practice, it is strongly demanded that the amplifier is provided with means for easy adjustment of the threshold level.

To overcome the aforesaid defects and difficulties, this invention provides a light amplifier using a semiconductor, in which one semiconductor PN junction laser is electrically divided into two regions; the two regions are separately excited and classified into an amplifying region and a saturable absorbing region according to the magnitudes of drive currents; the two regions are assembled together to form a light amplifier; a controllable threshold level is given to the light amplifier by the drive current; and a plurality of stages of such light amplifiers are connected in cascade so as to improve the threshold level characteristic. With reference to the drawings, this invention will hereinafter be described in detail.

FIG. 4 illustrates one embodiment of this invention. Reference numerals 5 and 6 indicate light input and output faces formed with processed antihalation films, 7 a P-type gallium arsenide semiconductor, 8 an N-type gallium arsemide semiconductor and 9 a junction plane therebetween. In order to form the amplifier in a strip transmission system, the central portion of an insulating layer 10 of $SiO_2$ vapor deposited on the P-type layer 7 is etched away to form a strip-like groove therein, in which ohmic electrodes 11 to 20 are vapor deposited while being electrically isolated from adjacent ones (refer to FIG. 5). Reference numerals 21 to 30 designate leads to the ohmic electrodes 11 to 20. An input light 3 is injected to the central area of the junction plane 9 of the input face 5 which is not covered with the $SiO_2$ insulating layer 10, and the input light is amplified to derive an output light 4 from the output face 6. PN junction regions which are driven by the ohmic electrodes 11 to 20 will hereinafter be referred to as regions 31 to 40 (refer to FIG. 6B). The regions 31, 33, 35, 37 and 39 are amplifying regions having the same amplification characteristic and those 32, 34, 36, 38 and 40 are saturable absorbing regions having the same attenuation characteristic. The amplification characteristic and the saturable absorbing characteristic of the respective regions are controlled by the drive currents.

From the functional point of view, the light amplifier of FIG. 4 can be regarded as such a light amplifier that the amplifying region 31 and the satirable absorbing region 32 make up one amplifier, (i.e. a unitary region) in which its input-output characteristic having a threshold level and that a plurality of such amplifiers of the same input-output characteristic are connected in cascade so as to provide for improving the threshold level characteristic.

Next, its operations will be described in detail. Attention is given first to the regions 31 and 32. For convenience of explanation, let it be assumed that the lengths $L_1$ and $L_2$ of the regions 31 and 32 are equal to each other ($L_1 = L_2 = L$, refer to FIG. 6B). The region 31 is driven in the forward direction at a current density $j_1$ through the lead 21, while the region 32 is driven in the forward direction at a current density $j_2$ through the lead 22. The following will analytically explain a fact that an appropriate selection of the current densities $j_1$ and $j_2$ will lead to the existence of the threshold level in the input-output characteristic of the light amplifier provided by a cascade connection of the regions 31 and 32.

Now it is assumed that the density-of-state function $\rho$ is $\rho_0 \exp(E/E_0)$ in accordance with a model of a semiconductor laser often used, where E is photon energy, $\rho_0$ and $E_0$ constants. The density-of-state function is taken as δ-function and the quasi-Fermi level is taken as F. The temperature is taken as T°K and if the region (the amplifying region or the saturable absorbing region) is driven at a current density $j$, the amplification coefficient (or the absorption coefficient) $g$ and the electron density $n$ of the region per unit volume and per unit time are expressed as follows:

$$g \approx A\ \rho_0\ F - E/4\ KT \exp\ (E/E_0) \quad (3)$$

$$n \approx B\ \rho_0 \exp\ (E/E_0) \quad (4)$$

where $A$ and $B$ are constants dependent upon temperature and $k$ the Boltzmann's constant.

On the other hand, the rate of a change in the electron density $n$ is given by the following equation:

$$n = j/qd - n/\tau - s.g. \quad (5)$$

where $d$ is the thickness of the junction 9, $q$ an electron charge, $\tau$ the life time of electrons in the case of natural emission and $s$ the photon density.

In a case where the region is driven by the forward current $j$ and no light is injected to the amplifier, the quasi-Fermi level $F$ is given by the following equation:

$$F = E_0\ l_n\ (j\ \tau/B\ \rho_0 qd) \quad (6)$$

using the following equation:

$$n = \tau/qd \quad (7)$$

By the way, the photon energy $E$ is expressed by $E=h\nu$ *where* $\nu$ *is the frequency of light and* $h$ the Planck's constant. In consideration of the equation (3) from this relation, the amplification (absorption) coefficient $g$ is dependent upon the frequency of the injected light. In this case, the frequency of the injected light is fixed at the following value:

$$\nu = E/h = E_0/h\ ln\ (4KT/VA\ \rho_0 E_0\ \tau_p) \quad (8)$$

where $V$ represents the volume of the region 31 or 32 occupied by light waves and $\tau_p$ the life time of photons based on loss such as scattering, diffraction and the like due to free electrons other than inductive absorption. The frequency of light given by the equation (8) bears the following physical meaning. The amplification coefficient $g$ includes $E$ (consequently the frequency of light) as a variable and has a maximum value at the following value $E$:

$$E = F - E_0 \quad (9)$$

from $$dg/dE = A\ \rho_0/4KT\ \{E/E_0 - 1 - E/E_0\}\ \exp\ (E/E_0) \quad (10)$$

Since the quasi-Fermi level $F$ of the conduction band includes the forward current $j$ as a variable, the maximum value of the amplification coefficient $g$ also changes with the drive current $j$ as well as the frequency of light. If the forward current $j$ is selected so that the maximum value of the amplification coefficient $g$ with respect to the frequency of light may satisfy the following relationship:

$$V \cdot g = VA\ \rho_0\ F - E/4KT \exp\ (E/E_0) = l/\tau_0 \quad (11)$$

The light frequency is given by the equation (8). If the drive current $j$ is taken as $jA$ in this case, the value $jA$ is given in the following equation:

$$jA = 4KTB \cdot qde/VA \cdot E_o \cdot \tau \cdot \tau_p \quad (12)$$

$jA$ corresponds to an oscillation-starting threshold level current $j_{th}$ of a laser oscillator. A value $\tau_p'$ of the oscillator corresponding to a value $\tau^p$ of the amplifier is given as follows:

$$1/\tau_p' = 1/\tau_p + v/L\ ln\ 1/R \quad (13)$$

where $L$ is the length of the region (the spacing between resonators), $R$ the reflection factor of the resonators and $v$ the velocity of light in the region. That is, the following relation is satisfied at a value $j_{th}$:

$$V \cdot g = 1/\tau_p' \quad (14)$$

Now, the values $jA$ and $j_{th}$ will be compared in magnitude with each other. If a reference $\beta$ is representative of a gain factor, a product $V \cdot g$ and the drive current density $j$ approximately bear the following relation therebetween $$Vg = v\ \beta\ j \quad (15)$$

so that the value $jA$ is smaller than $j_{th}$ by the value corresponding to the second term on the right side of the equation (13). An attenuation constant $\alpha[\text{cm}^{-1}]$ often used and the value $\tau_p'$ usually bear the following relation:

$$\alpha = 1\ /\ v\ \tau_p' \quad (16)$$

Since an attenuation constant $\alpha_o$ inherent to the system can be put as $\alpha_o = 1/v\ \tau_p$, the equation (13) can be rewritten as follows:

$$\alpha = \alpha_o + 1/L\ l\ n\ 1/R \quad (17)$$

For example, in a case in which $\alpha_o = 50\text{cm}^{-1}$, in which the reflection factor $R$ is 30 percent, and in which $L$=300$\mu$m, the second term on the right side of the equation (17) is substantially 40 cm$^{-1}$. In this case, it follows that $$jA \approx 5/9\ j_{th} \quad (18)$$

Next, a discussion will be made in connection with amplification (absorption) of light in the region in the case where light of the frequency given by the equation (8) is injected to the amplifier. In steady state, the amplification of light is expressed in the following equation:

$$\delta S/\delta Z = (Vg/v - 1/v\ \tau_p)\ S \quad (19)$$

where $Z$ is the distance in the direction of progress of light. Since $n = 0$ (steady state), the following equation is obtained from the equation (5):

$$n = j\tau/qd - \tau\ \text{S.g} \quad (20)$$

From the both equations (4) and (20), the following equation is obtained:

$$F = E_o ln\ (j\tau/B\rho_o qd - \tau\text{s.g.}/B\rho_o) \quad (21)$$

Rearranging the equation (3) by substituting thereinto $E$ in the equation (8) and the equation (21), the equation (3) is simplified as follows:

$$G = ln\ (I - P.G.) \quad (22)$$

where $$V \cdot \tau_p \cdot g = G \quad (23)$$

$$A \cdot E_o \cdot \tau/4kT \cdot B\ S = P \quad (24)$$

$$j\ /\ j_o = I \quad (25)$$

$$jA/e = 4kTBqd/VAE_o \cdot \tau \cdot \tau_p \quad (26)$$

where $e$ is the base ($e \approx 2.72$) of the natural logarithm. If the equation (19) is rewritten by the use of $G$ of the equation (23) and $P$ of the equation (24), the following equation is obtained:

$$dp/dZ = 1/V\ \tau_p\ (G - 1)\ P \quad (27)$$

In the condition that no injected light exists ($P$=0), where $G > 1$, that is, $I > e$ ($j > e_{jo}$), the equation (27) represents the amplifying action. In the case where $G > 1$, that is, $I > e$ ($j > e_{jo}$), the equation (27) represents the saturable absorbing action.

FIG. 7 shows the light input-output characteristics of the amplifying and saturable absorbing regions, in which the lengths of the regions are 300 $\mu$m, in which the internal loss $\alpha_o = 1/v\ \tau_p$ is 50 cm$^{-1}$ and in which $I$ is a parameter. The ordinate represents the output light intensity in the case of the amplifying region of $I > e$ and the input light intensity in the case of the saturable, absorbing region of $I > e$, while the abscissa represents the input light intensity in the case of the amplifying region and the output light intensity in the case of the saturable absorbing region. In FIG. 8, characteristic curves of $I$=30 and $I$=0.05 shown in FIG. 7 are used for proving the existence of the threshold level in the light amplifier (FIG. 9) comprising the amplifying region ($I$=30, that is, $j_I$=30$j_o$) and the saturable absorbing region ($I$=0.05, that is, $j_2$=0.05$j_o$) of cascade connection. The intersecting points of the two curves of $I$=30 and $I$=0.05 are identified by $A'$ and $B'$, and the values on the abscissa corresponding thereto $P_A'$ and $P_B'$ respectively. At first, an input light 3 of an intensity $P_o$ which satisfies the condition: $P_A' < P_o < P_B'$ is applied to the light amplifier of FIG. 9. The intensity $P_1$ of an output light 41 derived from the amplifying region 31 can be obtained on the ordinate using the characteristic curve of $I$=30 (refer to FIG. 8). The output light of the intensity $P_1$ is injected to the subsequent saturable absorbing region 32, and the intensity of an output light 42 from the region 32 can be obtained as an intensity $P_2$ on the abscissa by using the characteristic curve of $I$=0.05. Since $P_2 > P_0$, the light amplifier of the construction of FIG. 9 exhibits an amplifying action with respect to the input light of the intensity $P_0$ such that $P_A' < P_o < P_B'$. If $p_o$=$P_A'$ (or $P_o = P_B'$), it follows that $P_2$=$P_o$ as will readily seen from FIG. 8, and the input light 3 is neither amplified nor attenuated. Further, where $P_o < P_A'$ (or $P_o > P_B'$), it follows that $P_2 < P_o$ and the amplifier of FIG. 9 performs an attenuating action. Consequently, the value $P_A'$ provides the threshold level for amplification of the input light 3, while the value $P_B'$ represents a saturation value. Thus, in order for the amplifier to have the threshold level, it is necessary to select such a combination of the drive currents that the input-output intensity characteristic curves of the amplifying region and the saturable absorbing one may intersect each other at two points as shown in FIG. 8. In the combination of the amplifying region of $I$=10 with the saturable of $I$=0.05, no intersecting point exist as shown in FIG. 7 so that the amplifier of FIG. 9 serves as an attenuator. In the case of the combination of $I$=50 with $I$=0.5, the characteristic curves intersect each other so that the amplifying action is performed. However, since the threshold level is very low in this case, the threshold level by this combination is insignificant in practice in view of noises. As described above, the threshold level $P_A'$ and the saturation level $P_B'$ for amplification can be selectively controlled by selective combination of the drive currents to the amplifying region and the saturable absorbing region.

If the light amplifier constructed as depicted in FIG. 9 is called as one unitary region and referred to as a one-stage amplifier, its input-output characteristic is given by a curve $a$ in FIG. 10. The threshold level characteristic and the saturation characteristic can be improved by cascade connection of a plurality of light amplifiers (FIG. 9) of the same input-output characteristic. In FIG. 10, a curve $b$ shows the input-output characteristic in the case of cascade connection of two stages of the light amplifiers and a curve $c$ that in the case of cascade connection of five stages of the light amplifiers as shown in FIG. 11. The improvement in the threshold level characteristic and the saturation characteristic will be understood from FIG. 8. The intensities of output lights 42, 43, 44, 45 and 4 of the respective stages with respect to the input light 3 of the intensity $P_0$ are given as values $P_2$, $P_4$, $P_6$, $P_8$ and $P_{10}$ on the abscissa in FIG. 8. In the case of the five-stage light amplifier, the value $P_{10}$ is close to the value $P_B'$. In accordance with an increase in the number of stages, the output $P_{10}$ approaches $P_B'$ in response to only the slight excess of $P_0$ over the value $P_A'$. At the same time, this implies that the output becomes the value $P_B'$ with respect to an input greater than $P_B'$. Namely, the saturation value becomes the constant value $P_B'$ irrespective any intesity of the input. FIG. 4 illustrates an example of the concrete construction in the case of the five-stage light amplifier. If a bias condition: $I$=30 is expressed as the practical drive current density $j_1$, the following equation is obtained by using the equations (18) and (26):

$$j_1 = 30j_o \approx 6j_{th} \quad (28)$$

At a temperature 77°K, the oscillation starting threshold level current $j_{th}$ is usually about 1,000A/cm$^2$, so that $j_1$ has a value of approximately 6,000A/cm.$^2$ If the drive current assumes such a value, the light amplifier using a semiconductor will easily withstand such operating conditions.

As has been described in the foregoing in detail, the present invention has such advantages that the difficulty in coincidence of the operating wavelength resulting from the use of different active and saturable absorbing materials can be eliminated by using the amplifying region and the saturable absorbing region both divided from the same semiconductor PN junction laser. Moreover, unlike the threshold level fixed by the density, the relaxation time and the transition probability of the material used, the threshold level and the saturation value for amplification can easily be controlled by the intensity of the drive current to the amplifying region and the saturable absorbing region. A subminiature light amplifier having the threshold level due to the semiconductor PN junction is of extreme utility when employed in a light PCM communication system, a light regenerative repeater in an optical fiber transmission line and so on.

What I claim is:

1. A semiconductor light amplifier having a controllable threshold comprising, a light amplifier receiving in operation an input light signal and a plurality of bias signals for amplifying said input light signal when an intensity of said input light signal is greater than a threshold value, said light amplifier comprising threshold control means for controlling said threshold value in response to said bias signals, said light amplifier comprising amplifier means receptive in operation of said input light signal and a first of said bias signals for amplifying said input light signal and developing an output light signal, said amplifier means comprising gain control means receptive of said first bias signal for controlling a gain of said amplifier means in response to said first bias signal, and attenuation means receptive in operation of said amplifier means output light signal and a second of said bias signals for attenuating the amplifier means output light signal received to an intensity less than an intensity of said input light signal when an intensity of said input light signal is less than a first selected intensity value, for attenuating said amplifier means output light signal received to an intensity value less than an intensity of said input light signal when the intensity of said input light signal is greater than a second selected intensity value, and for attenuating said amplifier means output light signal to an intensity value greater than an intensity value of said input light signal when the intensity of said input light signal is between said first and second selected intensity values, said second selected intensity value being greater than said first selected intensity value, said attenuation means comprising attenuation control means receptive of said second bias signal for controlling a level of attenuation of said attenuation means in response to said second bias signal thereby determining said first and second selected intensity values.

2. A semiconductor light amplifier having a controllable threshold according to claim 1, comprising, a plurality of light amplifiers arranged in cascade with the first mentioned light amplifier, each of said light amplifiers comprising amplifier means and attenuation means.

3. A semiconductor light amplifier having a controllable threshold comprising, a generally prismatic semiconductor body having a longitudinal axis and two contiguous regions of opposite conductivity type having a planer P-N junction therebetween, said P-N junction extending in a longitudinal direction of said prismatic semiconductor body and extending to opposite end surfaces of said prismatic body, an insulating layer disposed on a surface of a first of said contiguous regions, said insulating layer having a channel disposed in a longitudinal direction of said semiconductor body and of sufficient depth to expose a strip of surface of said region of said semiconductor body underlying said insulating layer, said semiconductor body having a surface for receiving in operation an input light signal, a plurality of electrically isolated ohmic electrodes disposed overlying said insulating layer and making contact with said strip of exposed surface of said semiconductor body underlying said insulating layer and a common electrode disposed on a surface of a second of said continguous regions opposite said plurality of ohmic electrodes for applying a plurality of bias signals to said semiconductor body for developing in operation amplification characteristics having a selected intensity threshold value for amplifying an input light signal having an intensity greater than said intensity threshold value and attenuating an input light signal having an intensity less than said intensity threshold value, said semiconductor body comprising intensity threshold control means for varying a value of said intensity threshold in response to bias signals, and means within said semiconductor body for applying said bias signals to said intensity threshold control means.

* * * * *